(12) United States Patent
Cullen et al.

(10) Patent No.: US 10,418,994 B1
(45) Date of Patent: Sep. 17, 2019

(54) CIRCUIT FOR AND METHOD OF EXTENDING THE BANDWIDTH OF A TERMINATION BLOCK

(71) Applicant: Xilinx, Inc., San Jose, CA (US)

(72) Inventors: Edward Cullen, Naas (IE); Ionut C. Cical, Saggart (IE)

(73) Assignee: Xilinx, Inc., San Jose, CA (US)

( * ) Notice: Subject to any disclaimer, the term of this patent is extended or adjusted under 35 U.S.C. 154(b) by 14 days.

(21) Appl. No.: 15/647,756

(22) Filed: Jul. 12, 2017

(51) Int. Cl.
*H03K 19/00* (2006.01)
*H03K 19/177* (2006.01)

(52) U.S. Cl.
CPC ..... *H03K 19/0005* (2013.01); *H03K 19/1776* (2013.01)

(58) Field of Classification Search
None
See application file for complete search history.

(56) References Cited

U.S. PATENT DOCUMENTS

| | | | | |
|---|---|---|---|---|
| 3,794,941 A * | 2/1974 | Templin | ................. | G01R 27/02 324/619 |
| 5,856,904 A * | 1/1999 | Pelly | ....................... | H02H 3/50 361/111 |
| 5,867,127 A * | 2/1999 | Black | ..................... | H01Q 1/244 343/702 |
| 6,054,918 A * | 4/2000 | Holst | ....................... | G06F 7/02 340/146.2 |
| 6,233,061 B1 | 5/2001 | Huang et al. | | |
| 6,333,674 B1 * | 12/2001 | Dao | ....................... | H03F 1/083 330/282 |
| 6,963,218 B1 | 11/2005 | Alexander et al. | | |
| 7,566,960 B1 | 7/2009 | Conn | | |
| 7,639,168 B1 * | 12/2009 | Brubaker | ............. | H03M 1/0612 341/118 |
| 7,859,294 B1 | 12/2010 | Jenkins, IV | | |
| 7,970,811 B2 * | 6/2011 | Shen | ................... | H03H 21/0001 708/819 |
| 8,062,968 B1 | 11/2011 | Conn | | |
| 9,374,064 B1 * | 6/2016 | Li | ............................ | H03H 7/25 |
| 9,733,282 B2 * | 8/2017 | Schrom | ................. | H02M 3/157 |
| 9,882,587 B2 * | 1/2018 | Feng | ..................... | H04B 1/0067 |
| 2003/0234663 A1 * | 12/2003 | Aloisi | ................. | H04L 25/0298 326/30 |
| 2004/0100341 A1 * | 5/2004 | Luetzelschwab | ......... | H03F 1/56 333/32 |
| 2006/0132171 A1 * | 6/2006 | Nguyen | ..................... | H03F 1/56 326/30 |
| 2011/0074390 A1 * | 3/2011 | Bartlett | ............... | G01R 1/06766 324/76.41 |
| 2012/0105147 A1 * | 5/2012 | Harris | ....................... | H03F 1/56 330/57 |
| 2012/0235737 A1 * | 9/2012 | Reisner | ................. | H03F 1/0222 330/127 |
| 2013/0113575 A1 * | 5/2013 | Easter | ....................... | H01P 1/15 333/103 |

(Continued)

*Primary Examiner* — Crystal L Hammond
(74) *Attorney, Agent, or Firm* — John J. King

(57) ABSTRACT

A circuit for extending the bandwidth of a termination block is described. The circuit comprises an I/O contact configured to receive an input signal; and a termination circuit coupled to the I/O contact, wherein the termination circuit comprises a plurality of trim legs coupled between a power supply and the I/O contact, each trim leg having a switch to control the impedance in the trim leg.

20 Claims, 5 Drawing Sheets

(56) References Cited

U.S. PATENT DOCUMENTS

| | | | | |
|---|---|---|---|---|
| 2014/0266832 A1* | 9/2014 | Schrom | ............... | H02M 3/157 |
| | | | | 341/144 |
| 2015/0009980 A1* | 1/2015 | Modi | ............... | H03F 3/245 |
| | | | | 370/338 |
| 2015/0016634 A1* | 1/2015 | Powell | ............... | H04R 3/00 |
| | | | | 381/120 |
| 2015/0067292 A1* | 3/2015 | Grunzke | ............ | G06F 13/1694 |
| | | | | 711/170 |
| 2015/0236671 A1* | 8/2015 | Smith | ............... | H03H 7/01 |
| | | | | 327/553 |
| 2016/0294333 A1* | 10/2016 | Feng | ............... | H03F 3/217 |
| 2016/0294585 A1* | 10/2016 | Rahman | ............... | H04L 25/08 |
| 2017/0115382 A1* | 4/2017 | Koudar | ............... | G01S 7/524 |
| 2017/0134191 A1* | 5/2017 | Rahman | ............ | H04L 25/03885 |
| 2017/0257070 A1* | 9/2017 | Modi | ............... | H01L 29/20 |

* cited by examiner

CIRCUIT FOR AND METHOD OF EXTENDING THE BANDWIDTH OF A TERMINATION BLOCK

TECHNICAL FIELD

The present invention relates generally to circuit devices, and in particular, to a circuit for and method of extending the bandwidth of a termination block.

BACKGROUND

Signals are often transmitted between contacts of an integrated circuit device, such as between pin on integrated circuits (ICs) of a circuit board for example, or between contacts on connectors that provide an interface to enable the transmission of signals between two devices. Many interfaces use 50 ohm impedances as it is an optimal impedance for transfer of power. In order to achieve a constant impedance all the way from an on-die transmitter to the on-die receive circuitry of another integrated circuit, it is necessary to implement a 50 ohm impedance on the die for both the transmit and receive circuitry. This 50 ohm impedance would typically be a resistance to a power supply or to a DC voltage generated on-die.

On-die resistors have approximately +/−20% process variation, which means that a simple resistor is not sufficiently accurate to achieve the 50 ohm impedance. A commonly used design includes a trimmable resistor and a trimming circuit. The trimming circuit determines what trim legs should be enabled to trim the resistance to achieve 50 Ohm, and therefore remove the +/−20% process uncertainty. However, a trimming circuit can typically only measure impedance at DC, but not at high frequencies. Further, a limitation of this design is the trim legs that remain off. While these legs should be high impedance, the parasitics of a switch such as a transistor associated with the trim legs make the impedance look smaller at high frequencies (e.g. greater than 1 GHz). That is, it looks like all switches are enabled and therefore all of the trim legs are on at high frequencies, reducing the impedance which results in amplitude reduction and therefore limiting the bandwidth of a termination block.

Accordingly, methods and circuits that extend the bandwidth of a termination block are beneficial.

SUMMARY

A circuit for extending the bandwidth of a termination block is described. The circuit comprises an I/O contact configured to receive an input signal; and a termination circuit coupled to the I/O contact, wherein the termination circuit comprises a plurality of trim legs coupled between a power supply and the I/O contact, each trim leg having a switch to control the impedance in the trim leg.

Another circuit for extending the bandwidth of a termination block comprises an I/O contact configured to receive an input signal; and a termination circuit coupled to the I/O contact, wherein the termination circuit comprises a plurality of trim legs coupled between a power supply and the I/O contact, each trim leg having a switch for selectively coupling a resistor between a gate of a transistor and a drain of the transistor to enable the transistor to be implemented as an active inductor.

A method of extending the bandwidth of a termination block is also described. The method comprises configured an I/O contact to receive an input signal; and coupling a termination circuit to the I/O contact, wherein the termination circuit comprises a plurality of trim legs coupled between a power supply and the I/O contact, each trim leg having a switch to control the impedance in the trim leg.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below use an inductor, such as an active inductor, to compensate for the parasitic capacitances of the switches in trim legs of a termination circuit associated with an I/O contact of a receiver that are turned off. The circuit may comprise for example an I/O contact configured to receive an input signal; and a termination circuit coupled to the I/O contact, wherein the termination circuit comprises a plurality of trim legs coupled between a power supply and the I/O contact. Each trim leg may comprise a switch to control the inductance in the trim leg. According to some implementations, each of the trim legs may have a first switch for turning the trim leg on or off and a second switch for changing the inductance in the trim leg. According to some implementations, a switch may be used to enable an active inductor associated with a transistor of the trim leg.

Figure 1:
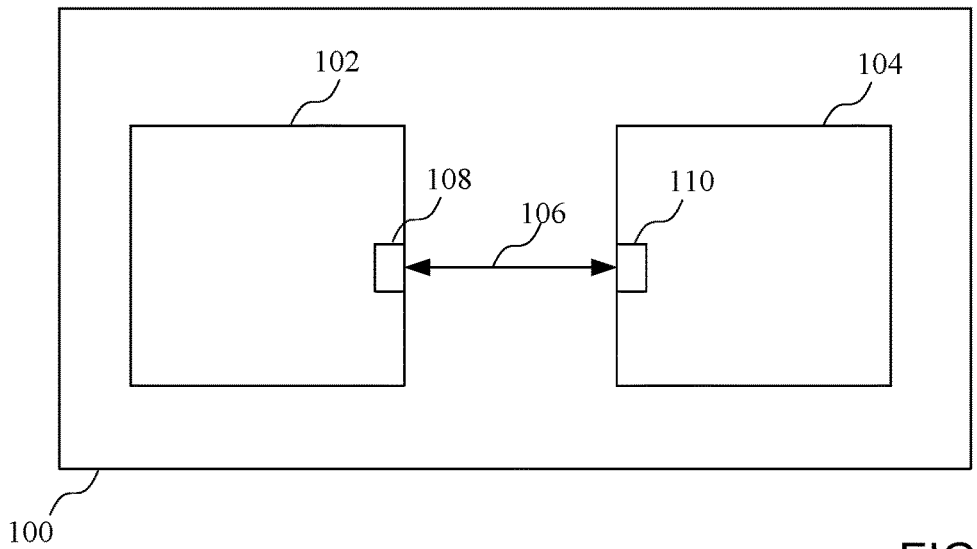
FIG. 1 is a block diagram of a system implementing a receiver having a termination block coupled to an I/O contact.

Turning first to FIG. 1, a block diagram of a system 100 implementing a receiver having a termination block coupled to an I/O contact is shown. A first device 102, which may be an integrated circuit device, is in communication with a second device 104, which may also be an integrated circuit device, by way of a communication link 106 between a first termination block 108 and a second termination block 110.

The communication link may be used to transmit signals by way of metal traces or other transmission elements, such as metal traces on a printed circuit board for example, using any communication protocol. The metal traces of the communication link 106 may be connected to pins of an I/O circuit of an integrated circuit device. As will be described in more detail below, a termination circuit may be implemented with an I/O contact of the devices 102 and 104 to extend the bandwidth of the termination blocks.

Figure 2:
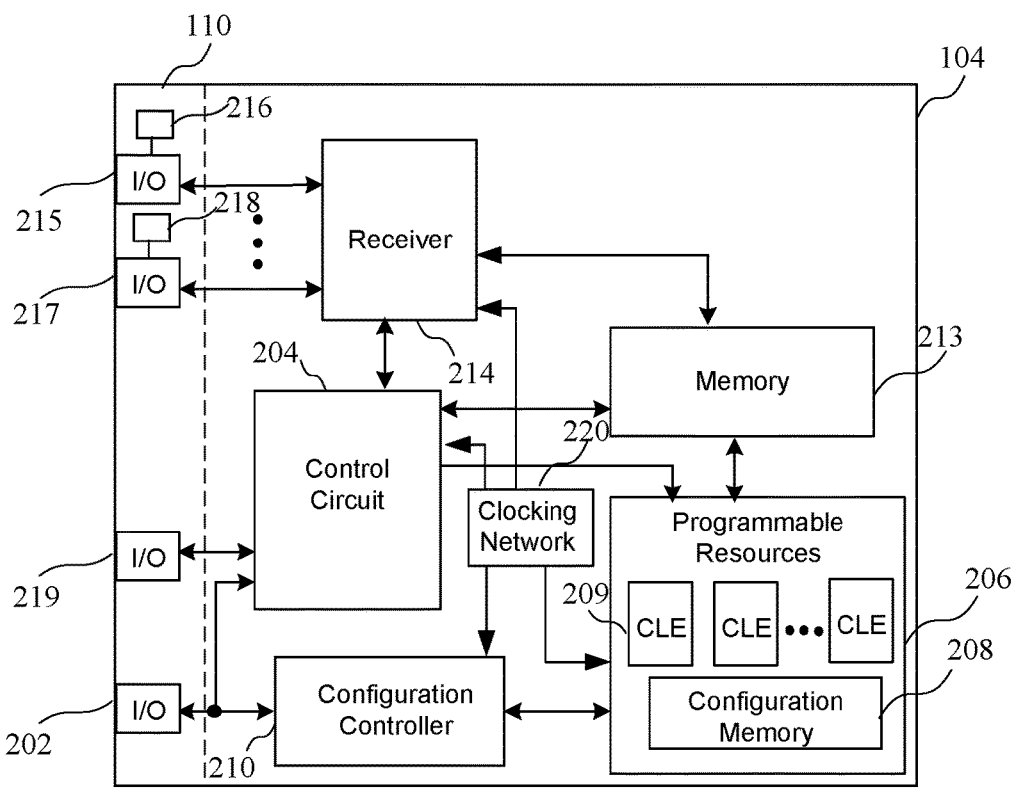
FIG. 2 is a block diagram of an integrated circuit device having a termination block coupled to an I/O contact of FIG. 1.

Turning now to FIG. 2, a block diagram of an integrated circuit device having a termination block coupled to an I/O contact of FIG. 1 is shown. In particular, an input/output (I/O) port 202 is coupled to a control circuit 204 that controls programmable resources 206 having configurable logic elements 209. Configuration data may be provided to the configuration memory 208 by a configuration controller 210. The configuration data enables the operation of the programmable resources 206. A memory 213 may be coupled to the control circuit 204 and the programmable resources 206. A receiver circuit 214 may be coupled to the control circuit 204, programmable resources 206 and the memory 213, and may receive signals at the integrated circuit by way of a termination block comprising an I/O contact 215, which may be an I/O contact, having a termination circuit 216 and a termination block comprising an I/O contact 217 having a termination circuit 218. While a port may be designated as an I/O port, it should be understood that the port could be a designated input port or a designated output port. The receiver 214 may be any type of receiver, such as a general purpose I/O (GPIO) receiver or a multi-gigabit transceiver for example. The I/O contacts 215 and 217 may comprise an input contact, which may be a pin of an integrated circuit device or connector for example, for receiving an input signal. Other I/O ports may be coupled to circuits of the integrated circuit device, such as I/O port 219 that is coupled to the control circuit 104 as shown. A clocking network 220 is coupled to various elements of the circuit of FIG. 2.

Figure 3:
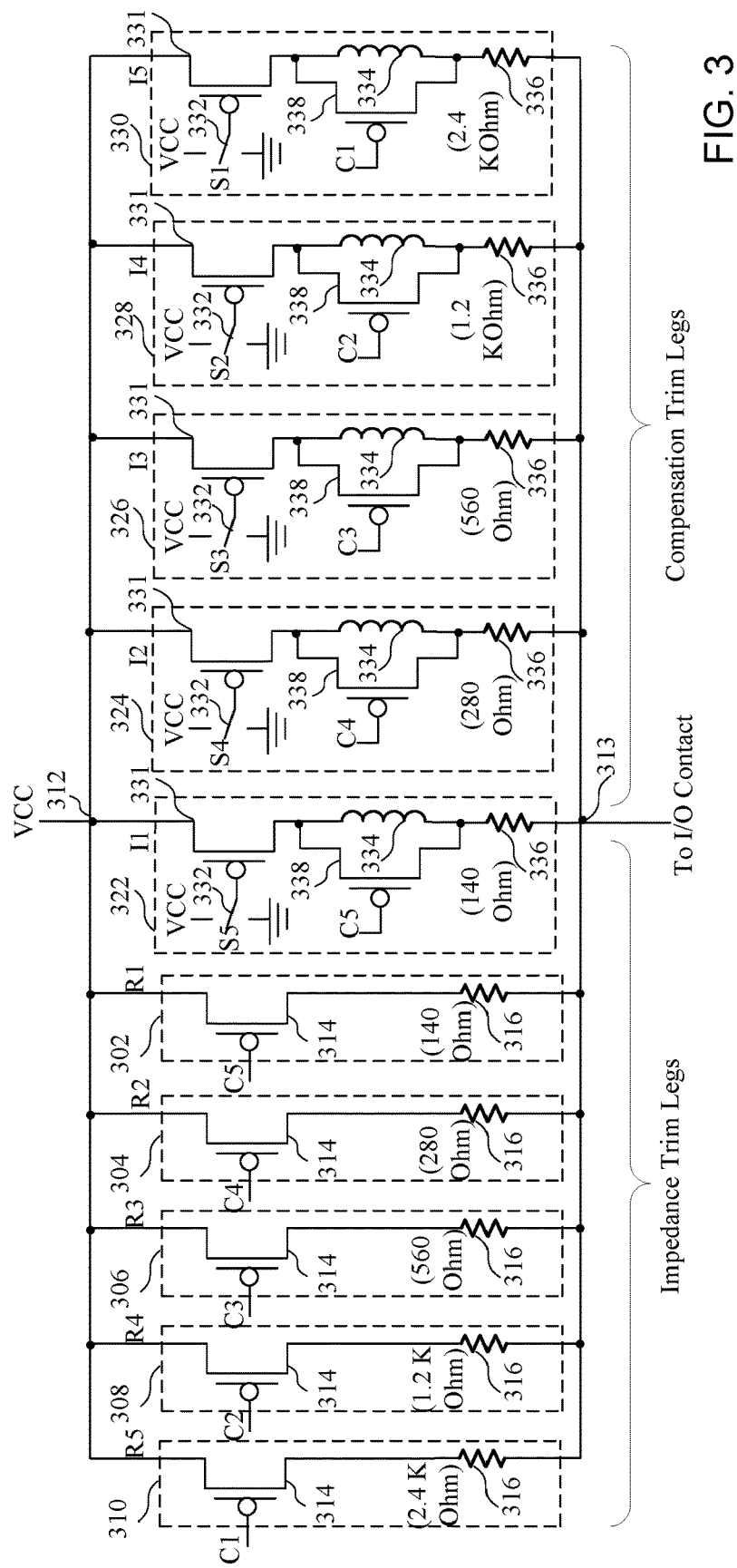
FIG. 3 is a block diagram of a termination block.

Turning now to FIG. 3, a block diagram of a termination block, such as termination blocks 216 and 218, is shown. According to the implementation of FIG. 3, a plurality of trim legs enabling trimming the impedance at an I/O contact are coupled between a reference voltage, shown here as VCC, and the I/O contact, such as I/O contact 215. Each trim leg of the plurality of trim legs can be switched in or out (i.e. coupled between the reference voltage and the I/O contact). Corresponding compensation legs could replace a trim leg having a 70 Ohm resistor for example, which may otherwise be implemented with the other impedance trim legs controlled to adjust the impedance in the trim legs to compensate for the parasitic capacitance of the switches that are turned off. When operating at a data rate of greater than 1 gigahertz (GHz) for example, it is difficult to implement trim legs that are high impedance when off. That is, the parasitic capacitances of the transistors make it appear that the trim legs are on at high frequencies, such as frequencies greater than 1 GHz.

More particularly, a plurality of impedance trim legs 302-312, which are impedance trim legs, are coupled between a reference voltage VCC 312 and an I/O contact 313. The I/O contact 313 may be any type of contact element or contact pin of an integrated circuit device or a connector for receiving an input signal or generating an output signal. Each of the trim legs 302-312 comprises a switch 314, shown here by way of example as a p-channel transistor, and a resistor 316. Each of the corresponding compensation legs 322-330 according to the implementation of FIG. 3 comprises a first transistor 331, shown here as a p-channel metal oxide semiconductor (PMOS) transistor, having a gate controlled by a switch 332. The switch 332 enables the application of the reference voltage or a ground voltage to turn on or off the transistor in response to a corresponding control signal (shown as S5-S1 for the compensation trim legs 322-330). That is, each of the compensation trim legs can be turned on or off using the switch 332.

Each of the compensation trim legs also comprises an inductor 334 coupled in series between the transistor 331 and a resistor 336. A switch 338, shown here as a transistor switch, is coupled in parallel with the inductor 334 and controlled by a corresponding control signal, enabling the inductor in each compensation trim leg to be bypassed, and therefore operate in either a resistive state or an inductive state. The switch 332 is used to turn on the trim leg (by providing a ground potential to the gate of transistor 318 in the resistive state), allow the gate to float in the inductive state, or turn off the trim leg (by providing the reference voltage VCC to the gate of the transistor 331 if the termination circuit is fully disabled, such as during a powerdown or if an IO is not used). The control signals (C5:C1) can be used to include the inductor in the compensation trim leg or to bypass the inductor in the compensation trim leg to achieve the 50 Ohm resistance at the I/O contact. That is, as the frequency of the input signal increases, the resistance in the trim legs 302-312 that are off decreases. As shown in FIG. 3, the switches 338 of the compensation trim legs 322-330 are controlled by control signals Cn:C1. The inductor can be switched in or out to increase the resistance in the impedance trim legs 302-312 that are off.

The resistances 316 of the plurality of impedance trim legs can be increasing from the first trim leg 302 to the last trim leg 310. By way of example, resistor 316 of impedance trim leg 302 may have a resistance of 140 Ohms, resistor 316 of impedance trim leg 304 may have a resistance of 280 Ohms, resistor 316 of impedance trim leg 306 may have a resistance of 560 Ohms, resistor 316 of impedance trim leg 308 may have a resistance of 1.12 KOhms, and resistor 316 of trim leg 310 may have a resistance of 2.24 KOhms. The resistors 336 of the corresponding compensation trim legs could have the same values. While 6 pairs of impedance trim legs and compensation trim legs are shown by way of example, it should be understood that any number of pairs of trim legs could be implemented. Further, while each trim leg includes a switch to control the inductance in the trim leg, it should be understood that not all of the trim legs necessarily include a switch to control the impedance.

Figure 4:
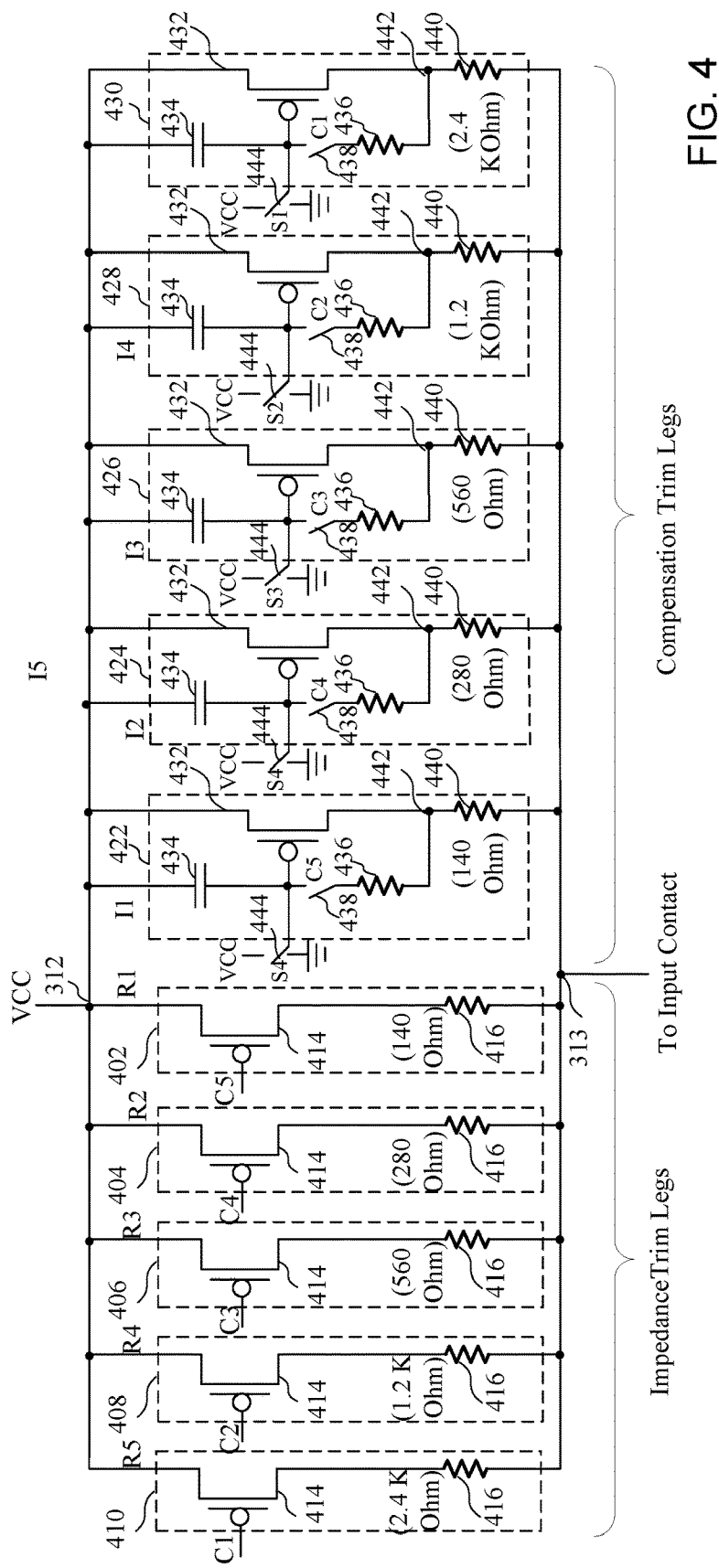
FIG. 4 is another block diagram of a termination block.

According to the implementation of FIG. 4, switches are also provided in each impedance trim leg to turn on or off the trim leg, and corresponding compensation legs to control the impedance in the trim legs by the use of active inductors. Each impedance trim leg of a plurality of impedance trim legs 402-410, includes a switch 414, shown here as a PMOS transistor, coupled in series with a resistor 416. Each of the compensation trim legs 422-430 includes a transistor 432, shown here as a PMOS transistor, and a capacitor 434 coupled between the reference voltage and a gate of the transistor. A resistor 436 is coupled by way of a first switch 438 between the gate and a drain of the transistor 432. Another resistor 440 is coupled between the drain of the transistor at a node 442 and the I/O contact. A second switch 444 enables coupling either a ground potential or the reference voltage to the gate of the transistor 432 to turn the transistor on or off, or allow the transistor to float.

The resistors 416 of the plurality of trim legs can be increasing from the first trim leg 402 to the last trim leg 412. By way of example, resistor 416 of trim leg 402 may have a resistance of 140 Ohms, resistor 416 of trim leg 404 may have a resistance of 280 Ohms, resistor 416 of trim leg 406 may have a resistance of 560 Ohms, resistor 416 of trim leg 408 may have a resistance of 1.12 KOhms, and resistor 416 of trim leg 410 may have a resistance of 2.24 KOhms. The resistors 440 of the corresponding compensation trim legs could have the same values. While PMOS transistors are shown in FIGS. 3 and 4, it should be understood that n-channel metal oxide semiconductor (NMOS) transistors could be implemented.

As the frequency increases, the impedance in each trim leg decreases. The capacitor 434 and the resistor 440 are selected so that at a certain frequency, the trim leg operates as a diode. In operation, the switch 438 can be controlled to turn on or off the trim leg or allow the transistor 432 to float, and switch 444 can be controlled to switch in or out resistor 436. If the compensating leg is in inductive state then switch 444 is open and switch 438 is closed, the gate of transistor 432 is biased by the RC. If in resistive state, then 438 is open and 444 connects PMOS gate to 0V. If off/powerdown, then 438 is open and 444 connects PMOS gate to supply.

At low frequencies the capacitor 434 looks like a high impedance relative to resistor 436, and therefore the impedance seen at node 442 is a diode connected PMOS. At high frequencies the capacitor 434 looks like a low impedance relative to 436, so the gate of the PMOS does not vary when the voltage at node 442 varies, and therefore the impedance seen is Rout of a PMOS in saturation. Rout of a PMOS operating in the saturation region will be higher than a diode connected PMOS, therefore the impedance will start low and progressively get higher, like an inductor. The physical size of this active inductor is small compared to a metal inductive coil, and therefore provides a size advantage. The use of switch 444 and switch 438 to enable switching between an inductive characteristic and a resistive characteristics.

For each of the pairs of impedance trim legs and corresponding compensation legs (i.e. having the same resistance values 416 and 440), the state in the compensation leg is selected based upon whether the corresponding trim leg is on or off. For example, if the trim leg 402 having a resistance R1 is on, then the gate of the switch 432 is pulled to 0V to put the corresponding compensation leg in a resistive state. If the trim leg 402 is off, then switch 444 is off and the gate of the switch 432 is controlled by the RC components. When the most significant trim leg (i.e. trim leg 422) is on and set to resistive, the compensation leg is therefore the same as a conventional trim leg. When the most significant trim leg is off, the compensation trim leg is put in an inductive state and therefore achieves an overall higher bandwidth. The termination block increases the bandwidth of on-die programmable termination blocks by using an active inductor to compensate for switch parasitics. The termination circuit of FIGS. 3 and 4 could be implemented with an input I/O contact of a receiver or an output I/O contact of a transmitter.

Figure 5:
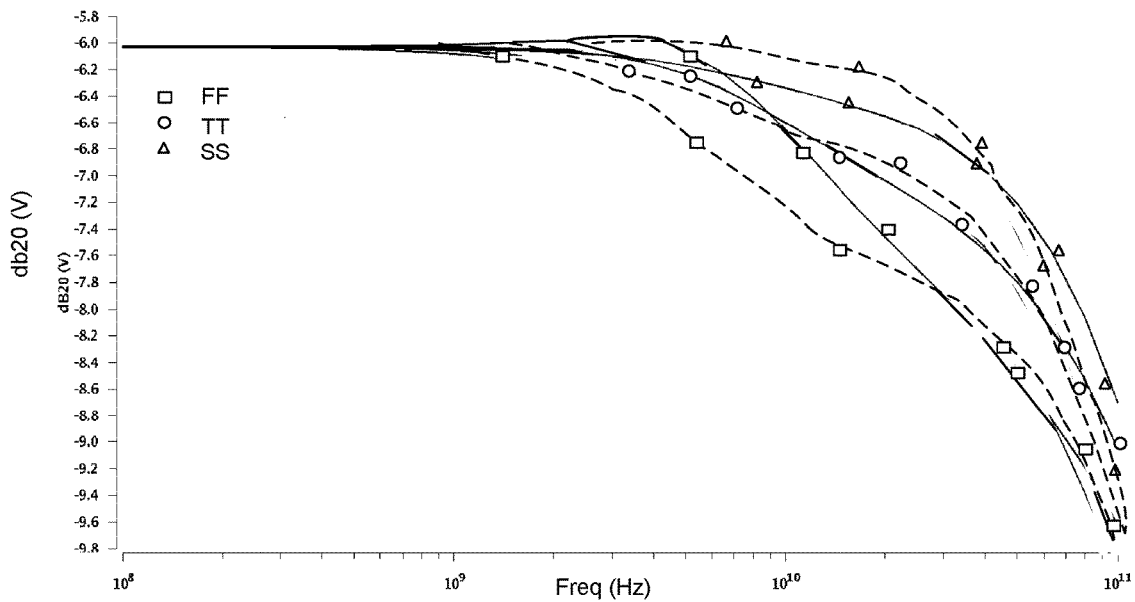
FIG. 5 is a graph showing a frequency response of signals at an I/O contact with a termination block according to FIG. 4 and a conventional termination block.

Turning now to FIG. 5, a graph showing a frequency response of signals at an I/O contact having a termination block according to FIG. 4 and a conventional trimmable termination block is shown. The graph of FIG. 5 shows the frequency response for each of three process corners (FF for fast, SS for slow and TT for typical), where the dashed lines shown conventional trimmable termination and the solid lines show the response using the circuit of FIG. 4. The trim code is set to achieve 50 Ohms at DC. An AC current source of 10 mA is applied and the amplitude response is observed. As expected −6 dBV is achieved at DC but for frequencies greater than 1 GHz, a loss is seen. The FF resistor is worst case because most of the programmable trim legs are off, and SS resistors is best case because almost all the trim legs are on.

Figure 6:
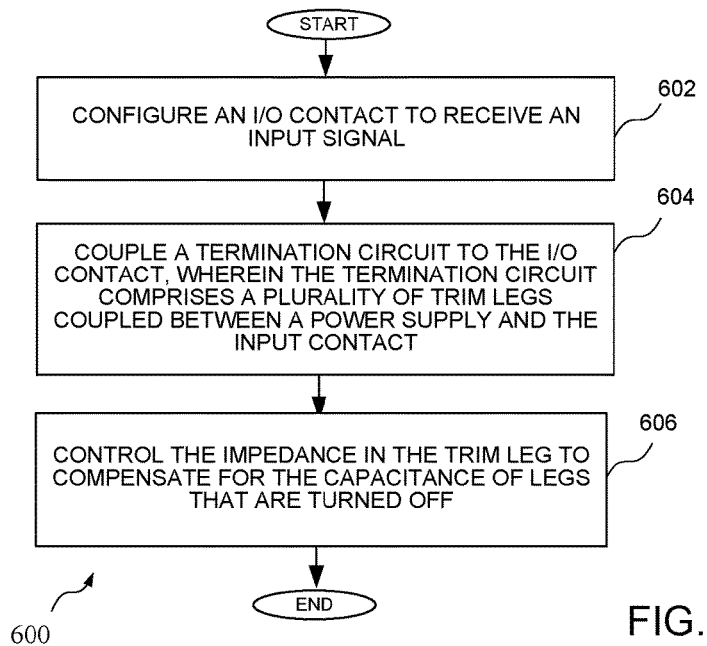
FIG. 6 is a flow chart showing a method of extending the bandwidth of a termination block of a receiver.

Turning now to FIG. 6, a flow chart shows a method of extending the bandwidth of a termination block of a receiver. The flow chart of FIG. 6 could be implemented using the circuit of either FIG. 3 or 4, or some other suitable circuit. An I/O contact is configured to receive an input signal at a block 602. A termination circuit is coupled to the I/O contact, wherein the termination circuit comprises a plurality of trim legs coupled between a power supply and the I/O contact at a block 604. The impedance in the trim leg is controlled to compensate for the capacitance of legs that are turned off at a block 606.

For each trim leg, a metal inductor formed in metal layers of an integrated circuit may be implemented, wherein the inductor may be bypassed using the switch. Further, for each trim leg, a switch may enable configuring a transistor as an active inductor. According to some implementations, the method may further comprise, for each trim leg of the plurality of trim legs, implementing a PMOS transistor, and coupling a resistor between a gate of the PMOS transistor and the I/O contact. A second switch may be used to decouple the trim leg.

Figure 7:
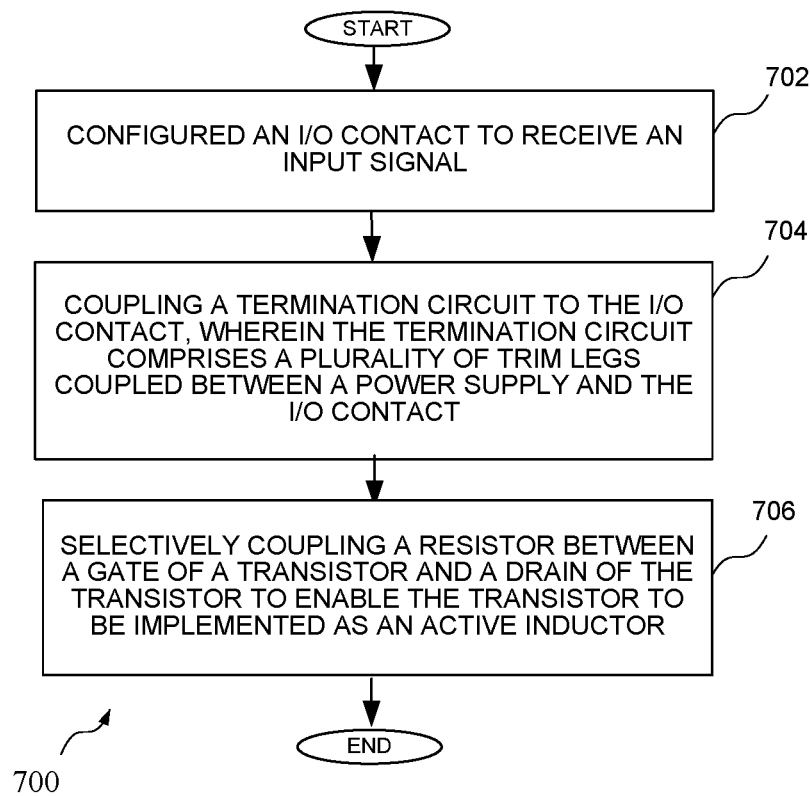
FIG. 7 is a flow chart showing another method of extending the bandwidth of a termination block of a receiver.

Turning now to FIG. 7, a flow chart shows another method of extending the bandwidth of a termination block of a receiver. The flow chart of FIG. 7 could be implemented using the circuit of FIG. 4, or some other suitable circuit. An I/O contact is configured to receive an input signal at a block 702. A termination circuit is coupled to the I/O contact at a block 704, wherein the termination circuit comprises a plurality of trim legs coupled between a power supply and the I/O contact. A resistor is selectively coupled between a gate of a transistor and a drain of the transistor to enable the transistor to be implemented as an active inductor at a block 706.

According to some implementations, the transistor may comprise a PMOS transistor, and a capacitor coupled between the power supply and the gate of the transistor. Further, for each trim leg, a resistor coupled between the switch and an I/O contact. A second switch that decouples the trim leg from the I/O contact may be implemented.

It can therefore be appreciated that new circuits for and methods of extending the bandwidth of a termination block have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for extending the bandwidth of a termination block, the circuit comprising:
    an I/O contact configured to receive an input signal; and
    a termination circuit coupled to the I/O contact, wherein the termination circuit comprises a plurality of trim legs coupled between a power supply and the I/O contact, each trim leg comprising an impedance trim leg and a compensation trim leg and having a first switch to control the impedance in the trim leg and a second switch to control whether the compensation trim leg is turned on or off.

2. The circuit of claim 1 wherein the first switch controls the impedance in the compensation trim leg.

3. The circuit of claim 1 further comprising, for each trim leg, an inductor comprising a metal inductor formed in metal layers of an integrated circuit, wherein, for each trim leg, the first switch enables bypassing the inductor.

4. The circuit of claim 1 wherein, for each trim leg, the first switch enables a transistor to be configured as an active inductor.

5. The circuit of claim 1 wherein each trim leg of the plurality of trim legs comprises a PMOS transistor, and the first switch couples a resistor between a gate of the PMOS transistor and the I/O contact.

6. The circuit of claim 1 wherein, for each trim leg, the second switch decouples the trim leg.

7. The circuit of claim 1 further comprising, for each impedance trim leg, a resistor coupled between a third switch and an I/O contact.

8. A circuit for extending the bandwidth of a termination block, the circuit comprising:
 an I/O contact configured to receive an input signal; and
 a termination circuit coupled to the I/O contact, wherein the termination circuit comprises a plurality of trim legs coupled between a power supply and the I/O contact, each trim leg having a switch for selectively coupling a resistor between a gate of a transistor and a drain of the transistor to enable the transistor to be implemented as an active inductor.

9. The circuit of claim 8 wherein the transistor comprises a PMOS transistor.

10. The circuit of claim 8 further comprising, for each trim leg, a capacitor coupled between the power supply and the gate of the transistor.

11. The circuit of claim 8 further comprising, for each trim leg, a resistor coupled between the switch and an I/O contact.

12. The circuit of claim 8 further comprising, for each trim leg, a second switch that decouples the trim leg.

13. The circuit of claim 8 wherein each trim leg of the plurality of trim legs comprises an impedance trim leg and a compensation trim leg.

14. A method of extending the bandwidth of a termination block of a receiver, the method comprising:
 configuring an I/O contact to receive an input signal;
 coupling a termination circuit to the I/O contact, wherein the termination circuit comprises a plurality of trim legs coupled between a power supply and the I/O contact, wherein each trim leg of the plurality of trim legs comprises an impedance trim leg and a compensation trim leg;
 controlling, for each trim leg, the inductance in the trim leg; and
 controlling, for each compensation trim leg, whether the compensation trim leg is turned on or off.

15. The method of claim 14 further comprising, for each trim leg, implementing a metal inductor formed in metal layers of an integrated circuit.

16. The method of claim 15 further comprising, for each trim leg, bypassing the metal inductor using a switch.

17. The method of claim 14 further comprising, for each trim leg, enabling a switch to configure a transistor as an active inductor.

18. The method of claim 14 wherein each trim leg of the plurality of trim legs comprises a PMOS transistor, the method further comprising coupling a resistor between a gate of the PMOS transistor and the I/O contact.

19. The method of claim 14 further comprising, for each trim leg, decoupling the trim leg.

20. The method of claim 14 wherein controlling, for each trim leg, the inductance in the trim leg comprises controlling an inductor using a switch, the method further comprising, for each trim leg, coupling a resistor between the switch and the I/O contact.

\* \* \* \* \*